United States Patent
Otsuji et al.

(10) Patent No.: US 9,018,683 B2
(45) Date of Patent: Apr. 28, 2015

(54) TERAHERTZ ELECTROMAGNETIC WAVE CONVERSION DEVICE

(75) Inventors: Taiichi Otsuji, Sendai (JP); Viacheslav Popov, Saratov (RU); Wojciech Knap, Montpellier (FR); Yahya Moubarak Meziani, Salamanca (ES); Nina Diakonova, Montpellier (FR); Dominique Coquillat, Montpellier (FR); Frederic Teppe, Montpellier (FR); Denis Fateev, Saratov (RU); Jesus Enrique Velazquez Perez, Salamanca (ES)

(73) Assignees: Tohoku University, Sendai-shi (JP); Centre National de la Recherche Scientifique (CNRS), Paris (FR); Universite Montpellier 2, Montpellier (FR)

( * ) Notice: Subject to any disclaimer, the term of this patent is extended or adjusted under 35 U.S.C. 154(b) by 0 days.

(21) Appl. No.: 13/991,407

(22) PCT Filed: Dec. 3, 2010

(86) PCT No.: PCT/JP2010/007074
§ 371 (c)(1),
(2), (4) Date: Jun. 3, 2013

(87) PCT Pub. No.: WO2012/073298
PCT Pub. Date: Jun. 7, 2012

(65) Prior Publication Data
US 2013/0277716 A1   Oct. 24, 2013

(51) Int. Cl.
*H01L 29/66* (2006.01)
*H01L 31/02* (2006.01)
(Continued)

(52) U.S. Cl.
CPC .......... *H01L 31/02* (2013.01); *H01L 29/42316* (2013.01); *H01L 29/7787* (2013.01); *H01L 31/1136* (2013.01)

(58) Field of Classification Search
CPC ..................... H01L 29/42316; H01L 29/7787; H01L 31/02; H01L 31/1136
USPC .......................................... 257/250, 252, 266
See application file for complete search history.

(56) References Cited

U.S. PATENT DOCUMENTS 7,915,641 B2    3/2011  Otsuji et al.
2008/0315216 A1 * 12/2008  Otsuji et al. .................... 257/83

FOREIGN PATENT DOCUMENTS

JP    2009-224467        10/2009
WO    WO-2006/030608 A1   3/2006

OTHER PUBLICATIONS

International Preliminary Report on Patentability and Written Opinion in PCT International Application No. PCT/JP2010/007074, dated Jun. 13, 2013.

(Continued)

*Primary Examiner* — Tan N Tran
(74) *Attorney, Agent, or Firm* — Venable LLP; Steven J. Schwarz; Tamatane J. Aga

(57) ABSTRACT

The purpose of the present invention is to improve the efficiency of conversion between terahertz electromagnetic wave energy and direct current energy via plasma waves in a terahertz electromagnetic wave conversion device with a field effect transistor structure. This invention has an HEMT structure having a substrate, an electron transit layer, an electron supply layer, a source and a drain, and includes a first and second group of gates. The gate length of each finger of the first group of gates is narrower than the gate length of each finger of the second group of gates, and each finger of each group of gates is disposed between the source and the drain on the same cycle. A first and second distance from each finger of the first group of gates to two fingers of the second group of gates adjacent to each finger are unequal lengths.

9 Claims, 14 Drawing Sheets

(51) Int. Cl.
*H01L 29/423* (2006.01)
*H01L 29/778* (2006.01)
*H01L 31/113* (2006.01)

(56) References Cited

OTHER PUBLICATIONS

Fateev et al., "Transformation of the Plasmon Spectrum in a Grating-Gate Transistor Structure with Spatially Modulated Two-Dimensional Electron Channel," Semiconductors, vol. 44, No. 11, pp. 1406-1413 (2010).

Popov et al., "Plasma Wave Instability and Amplification of Terahertz Radiation in Field-Effect-Transistor Arrays," Journal of Physics: Condensed Matter, vol. 20, Iss. 384208, pp. 1-6 (2008).

Aizin et al., "Terahertz Plasmon Photoresponse in a Density Modulated Two-Dimensional Electron Channel of a GaAs/AlGaAs Field-Effect Transistor," Applied Physics Letters, No. 91, pp. 163507-1-163507-3 (2007).

Dyakonov et al., "Shallow Water Analogy for a Ballistic Field Effect Transistor: New Mechanism of Plasma Wave Generation by dc Current," Physical Review Letters, vol. 71, No. 15, pp. 2465-2468 (1993).

Dyakonov et al., "Detection, Mixing, and Frequency Multiplication of Terahertz Radiation by Two-Dimensional Electron Fluid," IEEE Transactions on Electron Devices, vol. 43, No. 3, pp. 380-387 (1996).

Coquillat et al., "Room Temperature Detection of Sub-Terahertz Radiation in Double-Granting-Gate Transistors," Optics Express, vol. 18, No. 6, pp. 6024-6032 (2010).

Coquillat et al., "Terahertz Detection in a Double-Grating-Gate Heterotransistor," Journal of Physics: Conference Series, No. 193, pp. 012074-1-012704-4 (2009).

Khmyrova et al., "Analysis of Terahertz Plasma Resonances in Structures with Two-Dimensional Electron Systems Periodically Modulated by Interdigitated Gate," Journal of Applied Physics, vol. 108, pp. 074511-1-074511-6 (2010).

Nishimura et al., "An Intensity Modulator for Terahertz Electromagnetic Waves Utilizing Two-Dimensional Plasmon Resonance in a Dual-Grating-Gate High-Electron-Mobility Transistor," Japanese Journal of Applied Physics, vol. 49, pp. 054301-1-054301-7 (2010).

International Search Report issued in International Patent Application No. PCT/JP2010/007074 dated Jan. 11, 2011.

Extended European Search Report issued in European Patent Application No. 10860400.0 dated May 20, 2014.

Meziani et al., "Room Temperature generation of terahertz radiation from dual grating gate HEMT's," Infrared, Millimeter and Terahertz waves, 2008. IRMMW-THZ 2008 Designation: 1438; Session: M5D12, pp. 1-2.

\* cited by examiner

TERAHERTZ ELECTROMAGNETIC WAVE CONVERSION DEVICE

TECHNICAL FIELD

The present invention relates to a terahertz electromagnetic wave conversion device, and more particularly relates to a terahertz electromagnetic wave conversion device with a field effect transistor structure that includes a source, gates and a drain.

BACKGROUND ART

Terahertz electromagnetic waves in a frequency region of 0.1 THz to 30 THz lie in the intermediate area of high-frequency light and low-frequency radio waves, and the terahertz region remained largely undeveloped. Recently, since the laser beam technology has been developed, coherent generation and detection of terahertz electromagnetic waves is enabled, and because of the property that terahertz waves pass a material, various studies have been made in the security fields, such as food inspection and detection of poison concealed in envelopes, and the fields of, for example, tests for open faults in LSI, bimolecular imaging and dynamics and space stereoscope.

At present, the mainstream technique employed for detection of high-frequency electromagnetic waves at a normal temperature is a technique employing a Schottky barrier diode that is an electron transit element, and as the frequency is increased, more miniaturization is required, and accordingly, the sensitivity is lowered. According to the electron drift velocity, the usable frequency limit (the cutoff frequency) of a transistor is about 700 GHz.

On the other hand, in a case wherein a high-electron-mobility transistor (HEMT) is operated as a plasmon resonance element, the HEMT is functioned based on electronic polarization and vibration, without the dependence of real-space electron transport, and therefore, sensitivity will not be decreased even in a super high frequency range of the terahertz or higher. For the HEMT, since a two-dimensional electron gas (2 DEG) present in the electron transit layer has a very high electron density of about $10^{12}$ cm$^{-2}$, the property as a fluid appears more remarkably than the movement of the electron. When such a two-dimensional electron fluid is externally excited, a collective vibrational electron wave, i.e., a plasma wave, is generated. When the plasma wave generated inside the structure of a resonator is quantized, a plasmon is obtained. While the drift velocity of electrons is about $10^7$ cm/s at most, the velocity of the plasma wave is about $10^8$ cm/s, which is greater by one to two digits than the drift velocity. Based on this fact, the plasmon resonance frequency generated due to the plasma wave is higher than the cutoff frequency of a conventional transistor, for which carrier transport is employed, and can reach the frequency level of several tens of THz. When the excitation of the two-dimensional plasmons is performed in this manner, detection of terahertz electromagnetic waves can be performed.

A mechanism for conversion between terahertz electromagnetic waves and plasma waves will now be described. Since an electromagnetic wave that propagates in free space is a transverse wave, while a plasma wave that is a collective vibrational electron wave is a polarized (longitudinal) evanescent wave oscillated in a non-radiation mode, all of the vibration components that move outward from the Plasmon area are attenuated, and essentially, the conversion between the two waves can not be performed. Further, it is required that the law of energy conservation and the law of momentum conservation be satisfied for performing this conversion; however, as described above, the velocity of the plasma wave is extraordinarily lower than the speed of light in vacuum ($3\times10^{10}$ cm/s), and in addition to this, the wavelength of the plasma wave is extraordinarily shorter than the wavelength of the electromagnetic wave. Since the vibration energy of the electromagnetic wave (photon) and the plasmon is proportional to the frequency, and the momentum is inversely proportional to the wavelength, when conversion is mutually performed between the plasmon and the electromagnetic wave that are regarded as those oscillated at the same frequency, the energy is conserved according to the law, but the momentum is not conserved. Also from this viewpoint, the performance of conversion is difficult.

The relationship between the wavenumber and the frequency for an electromagnetic wave and a plasma wave is shown in FIG. 1. A frequency k represented along the horizontal axis is the amount that is proportional to $1/\lambda$ and is related to the momentum. A frequency f represented along the vertical axis is the amount related to energy. As is apparent from FIG. 1, the law of conversion of momentum can not be established for a mode conversion at a specific frequency $f_3$. In this drawing, a gradient c of a line for an electromagnetic wave is the speed of light of about $3\times10^8$ m/s. Further, a gradient $v_p$ of a line for a plasma wave is a value of about $10^5$ to $10^6$ m/s, which is proportional to the square root of an electron density n. The relationship in FIG. 1 is schematically shown, and the gradients of the two curves are different by about two digits.

In FIG. 2, a conventional terahertz electromagnetic wave detection device is shown that can resolve the above described problem to perform mode conversion. An HEMT structure is provided, which includes a substrate 201, an electron transit layer 202, an electron supply layer 203, a source 204 and a drain 205, and first group gates G1 and second group gates G2 are arranged. A gate length L1 for the first group gates G1 (the individual comb-like gates are called "fingers") is shorter than a gate length L2 for the individual second group gates G2, and the gates of these groups are located between the source 204 and the drain 205 with the same spatial periodicity W. Since the first group gates G1 and the second group gates G2 are gratings having the periodicity W, and are interdigitated each other, these two groups of gates are called together "interdigitated dual grating gates".

At this time, assume that a high voltage $V_{G1}$ was applied to the individual first group gates G1, and a low voltage $V_{G2}$ ($<V_{G1}$) was applied to the individual second group gates G2. More electrons have gathered and been confined under the first group gates G1 than under the second group gates G2, and therefore, a difference in the electron densities n has occurred. As described above, the speed of the plasma wave is proportional to the square root of the electron density n. When the first group gates G1 and the second group gates G2 are under the different voltage applied states, electron plasma waves present below the individual gates become localized standing waves, for which the widths of the gates are employed as periodicity, and the resonant frequency of the fundamental standing wave can be represented by the following equation.

[Equation 1]

$$f_p = \frac{v_p}{iL} \propto \frac{\sqrt{n}}{iL} \quad (1)$$

where i denotes the interger of 2 or 4, and in a case wherein a symmetric boundary is present at both ends of the high electron density area below each gate, these two ends are employed as either nodes or anti-nodes, and therefore, the value of i is 2, or in a case wherein an asymmetric boundary is present, one of the two ends is a node (or an anti-node), while the other end is an anti-node (or a node), and therefore, the value of i is 4. As for the first group gates G1, since the electron density n is higher and the gate length L is shorter than those for the second group gates G2, a relationship is established representing that the resonant frequency of the first group gates G1 is sufficiently higher.

The periodicity of the resonant frequency of the plasma wave changes the line for the plasma wave shown in FIG. 1. Specifically, the line of the plasma wave is folded at the position of a wavenumber π/W that is the boundary of the Brilliouin zone due to the periodicity of the gates. It is apparent from FIG. 3 that, as the result of folding, there is a frequency at which the law of energy conservation can be satisfied, and the law of momentum conservation can also be satisfied. It can be said that the first and second group gates G1 and G2, alternately arranged with the same periodicity W, serve as antennas to enable the performance of mode conversion between the terahertz electromagnetic waves and the plasma waves.

The relationship in FIG. 3 is schematically shown, and it should be noted that, while the actual magnitude of the gradient $v_p$ is taken into account, multiple frequencies are generated at which both the law of energy conservation and the law of momentum conservation are satisfied.

Further, a case wherein different voltages are applied to the first group gates G1 and the second group gates G2 has been employed for the above description, and when one voltage is set higher than the other, the same analysis is established. For example, instead of applying a voltage, the second group gates G2 may be short-circuited, and a voltage may be applied only to the first group gates G1.

Furthermore, when the gate lengths differ for the first group gates G1 and the second group gates G2, regardless of whether the potentials are equal, the resonant frequency is also different, and periodicity occurs, so that the same analysis as in the above description is established.

In patent literature 1, a terahertz electromagnetic radiation device that employs the structure shown in FIG. 2 is disclosed.

With the above described mechanism, terahertz electromagnetic wave energy can be converted into plasma waves by a periodic antenna structure, i.e., plasma waves can be excited. Further, when on the contrary, plasma waves are excited by a specific external factor, conversion of the plasma energy into terahertz electromagnetic waves can also be performed. Conversion of terahertz electromagnetic waves into plasma waves is effective means as a terahertz electromagnetic wave detection mechanism, and conversion of plasma waves into terahertz electromagnetic waves is effective means as a terahertz electromagnetic wave generation mechanism. The two mechanisms for detection and generation of terahertz electromagnetic waves will now be described.

When terahertz electromagnetic wave energy is converted into plasma waves, and the plasma waves are excited, it is required that non-linearity of the plasma waves be effectively utilized again in order to detect terahertz waves. A terahertz electromagnetic wave detection device is a device, such as a Schottky barrier diode as a typical example, that outputs a direct-current voltage or a direct current in accordance with incident electromagnetic power of terahertz waves. The current-voltage characteristic of a diode is a non-linear characteristic that a current is exponentially increased, together with a voltage, in the forward direction. As shown in FIG. 4A, when a terahertz electromagnetic wave has entered a Schottky barrier diode, to which a predetermined positive direct-current bias $V_{DC}$ was applied in advance, a diode current is modulated, at the frequency of the incident electromagnetic wave, in consonance with an instantaneous voltage component $V_a \sin \omega t$. At this time, since the current-voltage characteristic of the diode is non-linear, a distortion component shown in FIG. 4B occurs in the current of the diode, although the incident terahertz electromagnetic wave is a sine wave signal of a single frequency. As a result of the non-linear response, it is apparent that the direct-current component that indicates the temporal average value of the diode current has been fluctuated from the original value of the direct current. This change $\Delta I_{TH}$ depends on the electric power of the incident terahertz electromagnetic wave, and therefore, when the change of the direct current of the diode is measured, the incident electric power of the terahertz electromagnetic wave can be detected. For this process, a load resistor need only be connected to the diode to detect the fluctuation of the diode current as a change $\Delta V_{THZ}$ of a voltage generated at the two ends of the load resistor. As the non-linearity of the current-voltage characteristic is great, the detection sensitivity is increased.

In a case wherein terahertz electromagnetic waves are converted into plasma waves, the non-linearity of plasma waves can also be employed to provide the same detection mechanism as described above. At this time, in a case wherein plasma waves are excited for the electron transit layer of the above described transistor, the electrode portion of the transistor can extract a detection signal as a change of a direct current or a direct-current voltage, and according to the source-grounded structure where a source electrode is grounded and a drain electrode is connected to a power source via a load resistor, fluctuations of a drain electrode are obtained from the drain electrode. At this time, in order to generate a significant change of the drain voltage, i.e., in order to perform sensitive detection of terahertz electromagnetic waves, it is required that, at the drain electrode, the above described distortion component should be generated, with as a large magnitude as possible, for the plasma waves that were excited by absorbing the terahertz electromagnetic waves. The detailed theory for detecting terahertz electromagnetic waves based on plasma waves by employing a transistor with the simplest structure having a single gate is described in non-patent literature 5, and according to this description, the highest detection sensitivity is obtained in a case wherein a source electrode is electrically grounded and a drain electrode is employed as electrically an open end. In a case wherein both the source electrode and the drain electrode are grounded, a voltage change can not occur in the drain electrode, and thus, it is understood that the drain electrode should be electrically an open end. It is important here that an electrically different boundary condition (hereinafter referred to as an "asymmetrical boundary condition") is provided for both ends (the source end and the drain end) of an area in an electron transit layer where plasma waves produce standing waves. It is apparent, from different viewpoints, that energy of terahertz electromagnetic waves is converted into direct current energy via plasma waves present under the asymmetric boundary condition.

Furthermore, in the electron transit layer of the transistor, temporal variations of electron densities in the spatial distribution constantly occur due to, for example, a thermal disturbance, or the presence of a direct current that flows from the drain to the source (microscopically, electron drift motion), or a photocurrent that is accompanied by photoelectrons and an electron hole pair generated by absorption of light. The collective vibrational electron wave that changes along the time axis is a plasma wave. Especially, in a case wherein a direct current flows between the source and the drain by the electron drift motion, and wherein the asymmetric boundary condition that both the source end and the drain end should be respectively a short-circuited end and an open end is established, the amplitude of the plasma wave is gradually increased by repeating multi-reflection at the drain end, and self-oscillation occurs. This is called a plasma instability. The principle of the plasma instability will now be described.

For simplifying the explanation, employ the ideal asymmetric boundary condition that the source end is short-circuited and the drain end is open. At this time, a case wherein the current component of a plasma wave reciprocally propagates between the source and drain is employed. The plasma wave is a charge density wave, for which localized fluctuations of charges generated by local variations in the electron density distribution, are shifted at a specific speed. Therefore, the current component of the plasma wave is provided by employing a product of localized variations $e\Delta n$ of a charge density and a propagation speed vp of a plasma wave. Here, e denotes an elementary charge, and $\Delta n$ denotes localized variations of the charge density. At this time, assuming a case wherein, in the electron transit layer, electrons move from the source to the drain at a uniform drift velocity vd by applying a direct current bias between the source and the drain, a current jF of a progressive wave that propagates from the source to the drain (this path is defined as a forward path) is provided as $jF=e\Delta nF \cdot vpF=e\Delta nF \cdot (s+vd)$, where $\Delta nF$ and vpF represent $\Delta n$ and vp at the pertinent time. On the other hand, a current component jB of the wave along the return path (a regressive wave) of the plasma wave that was fully reflected at the drain end (the ideal open end) is provided as $jB=e\Delta nB \cdot vpB=e\Delta nB \cdot (s-vd)$, where $\Delta nB$ and vpB represent $\Delta n$ and vp at the pertinent time. Since the plasma wave flows in the forward path while being superimposed with the drift current of electrons, the velocity of s+vd is provided (s is the velocity of the plasma wave), and since in the return path, the plasma wave moves backward against the drift current, the velocity of s−vd is provided. Since the electric current is maintained at the ideal open end before and after the reflection, jF=jB is established. Generally, the order employed for s is $10^8$ cm/s and the order employed for vd is $10^5$ to $10^6$ cm/s, and since s>vd is established, $\Delta nB > \Delta nF$ is established based on the condition of jF=jB. That is, after the reflection has been performed, the fluctuation of the charge density is increased. As the reflection is repeated, the fluctuation of the charge density is increased. At this time, when C (F: farad) denotes the capacitance of a capacitor arranged between the gate electrode and the electron transit layer, a relationship of Q=en=CVg is established for the capacitance C and a potential Vg between the gate and the electron transit layer, and therefore, the gate potential Vg changes in accordance with the fluctuation $e\Delta n$ of the charge density. When the increase of the charge density continues in this manner, the fluctuation of the gate potential is also sequentially increased, and the oscillation state becomes unstable. This plasma instability was proved by M. Dyakonov and M. Shur in 1993 (see nonpatent literature 4). This is also called the Dyakonov-Shur (DS) instability. The necessary condition for induction of the DS instability is asymmetry of the boundary condition (the condition for the source-end impedance and the drain-end impedance) of a plasma wave resonator (here, an electron transit layer).

As a conclusion for the two operation mechanisms, i.e., those for detection and generation of terahertz electromagnetic waves, so long as terahertz electromagnetic wave energy can be efficiently converted into direct current energy by performing conversion between terahertz electromagnetic waves and plasma waves, a very sensitive terahertz electromagnetic wave detection device can be obtained, and so long as direct current energy can be efficiently converted into terahertz electromagnetic waves, a very efficient, high-output power terahertz electromagnetic wave generation device can be obtained.

CITATION LIST

Patent Literature

PTL 1: PCT International Publication No. WO 2006/030608
PTL 2: Japanese Patent Laid-Open No. 2009-224467

Non Patent Literature

NPL 1: D. V. Fateev, V. V. Popov, and M. S. Shur, "Transformation of the Plasmon Spectrum in a Grating Gate Transistor Structure with Spatially Modulated Two Dimensional Electron Channel", Semiconductors, Vol. 44, No. 11, pp. 1406-1413, 2010.

NPL 2: V. V. Popov, G. M. Tsymbalov and M. S. Shur, "Plasma wave in-stability and amplification of terahertz radiation in field-effect-transistor arrays", J. Phys.: Condens. Matter, Vol. 20, iss. 384208 (6 pages), 2008.

NPL 3: G. R. Aizin, D. V. Gateev, G. M. Tsymbalov, and V. V. Popov, "Terahertz plasmon photoresponse in a density modulated two-dimensional electron channel of a GaAs/AlGaAs field-effect transistor", Appl. Phys. Lett. Vol. 91, iss. 163507 (3 pages), 2007.

NPL 4: M. Dyakonov and M. Shur, Phys. Rev. Lett. Vol. 71, pp. 2465-2468, 1993.

NPL 5: M. Dyakonov and M. Shur, IEEE Trans. Electron Devices Vol. 43, pp. 380-387, 1996.

SUMMARY OF INVENTION

Technical Problem

However, there is a problem for the conventional structure shown in FIG. 2 that the efficiency of conversion between terahertz electromagnetic wave energy and direct current energy via plasma waves is low.

The present invention is provided to resolve this problem, and one objective of the present invention is to improve efficiency of conversion between terahertz electromagnetic wave energy and direct current energy via plasma waves, which is performed by a terahertz electromagnetic wave conversion device with a field effect transistor structure that includes a source, gates and a drain. Here, a "conversion device" represents a device that includes both a detection device that converts terahertz electromagnetic wave energy into direct current energy via plasma waves, and a radiation device that converts direct current energy into terahertz electromagnetic waves via plasma waves.

In order to achieve the objective, according to a first aspect of the present invention, a terahertz electromagnetic wave conversion device with a field effect transistor structure having a source, gates and a drain, the terahertz electromagnetic wave conversion device comprising on a surface of the field effect transistor structure:

first group of gates having a plurality of fingers arranged in parallel at intervals; and second group of gates having a plurality of fingers arranged in parallel at intervals;

wherein a first distance D1 and a second distance D2 between each finger of the first group gates and two of the fingers of the second group gates adjacent to each finger are unequal lengths.

Further, a second aspect of the present invention is characterized in that, for the first aspect, D1/D2 is about 0.55.

Furthermore, a third aspect of the present invention is characterized in that, for the first or the second aspect, a gate length of at least one of the group gates is gradually reduced from the source to the drain.

Moreover, a fourth aspect of the present invention is characterized in that, for the first or the second aspect, the source is short-circuited, and a DC bias current is applied between the source and the drain.

Further, a fifth aspect of the present invention is characterized in that, for the fourth aspect, the gate length of the first group gates is smaller than the gate length of the second group gates, a potential for the first group gates is higher than a potential for the second group gates, and an electron density below the first group gates is higher than an electron density below the second group gates.

Furthermore, a sixth aspect of the present invention is characterized in that, for the fourth aspect, the gate length of the first group gates is smaller than the gate length of the second group gates, a potential for the first group gates is equal to a potential for the second group gates, and an electron density below the first group gates is higher than an electron density below the second group gates.

Moreover, a seventh aspect of the present invention is characterized in that, for the fourth aspect, the gate length of the first group gates is equal to the gate length of the second group gates, a potential for the first group gates is higher than a potential for the second group gates, and an electron density below the first group gates is higher than an electron density below the second group gates.

Further, an eighth aspect of the present invention is characterized in that, for one of the fifth to the seventh aspects, the gate length of the first group gates is gradually reduced from the source to the drain.

Furthermore, a ninth aspect of the present invention is characterized in that, for the eighth aspect, the gate length is determined so that, for each finger of the first group gates, a ratio of the square root of an electron density with respect to the gate length is a predetermined value.

Moreover, a tenth aspect of the present invention is characterized in that, for one of the first to the ninth aspects, the field effect transistor structure is an HEMI structure.

Further, according to an eleventh aspect of the present invention, a terahertz electromagnetic wave conversion device with a field effect transistor structure having a source, gates and a drain, the terahertz electromagnetic wave conversion device comprising on a surface of the field effect transistor structure:

first group of gates having a plurality of fingers arranged in parallel at intervals; and second group of gates having a plurality of fingers arranged in parallel at intervals;

wherein the plurality of fingers of the first group gates and the plurality of fingers of the second group gates are alternately arranged; and wherein a first distance D1 between each finger of the first group gates and the fingers of the second group gates adjacent to the drain side of the each finger and a second distance D2 between the each finger and the fingers of the second group gates adjacent to the source side of the each finger are unequal lengths.

According to the present invention, for first group gates G1 and second group gates G2 arranged between a source 204 and a drain 205, unequal distances are set as a first distance D1 and a second distance D2 that are extended from each of the fingers of the first group gates G1 and the two of the second group gates G2 that are adjacent to the pertinent finger, and therefore, the efficiency of conversion, performed by a terahertz electromagnetic wave conversion device with a field effect transistor structure, between terahertz electromagnetic wave energy and direct current energy via plasma waves, can be remarkably improved.

DESCRIPTION OF EMBODIMENTS

Figure 1:
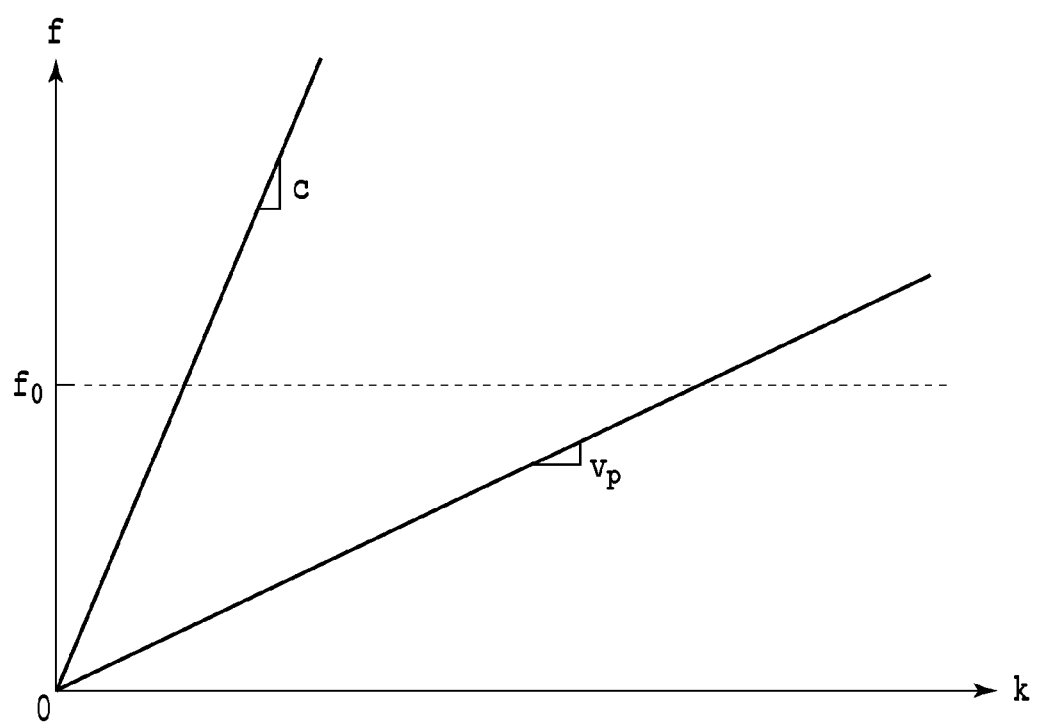
FIG. 1 is a schematic diagram showing a relationship of the wavenumber and the frequency for electromagnetic waves and plasma waves.

The embodiments of the present invention will now be described in detail while referring to the drawings.

First Embodiment

Figure 5:
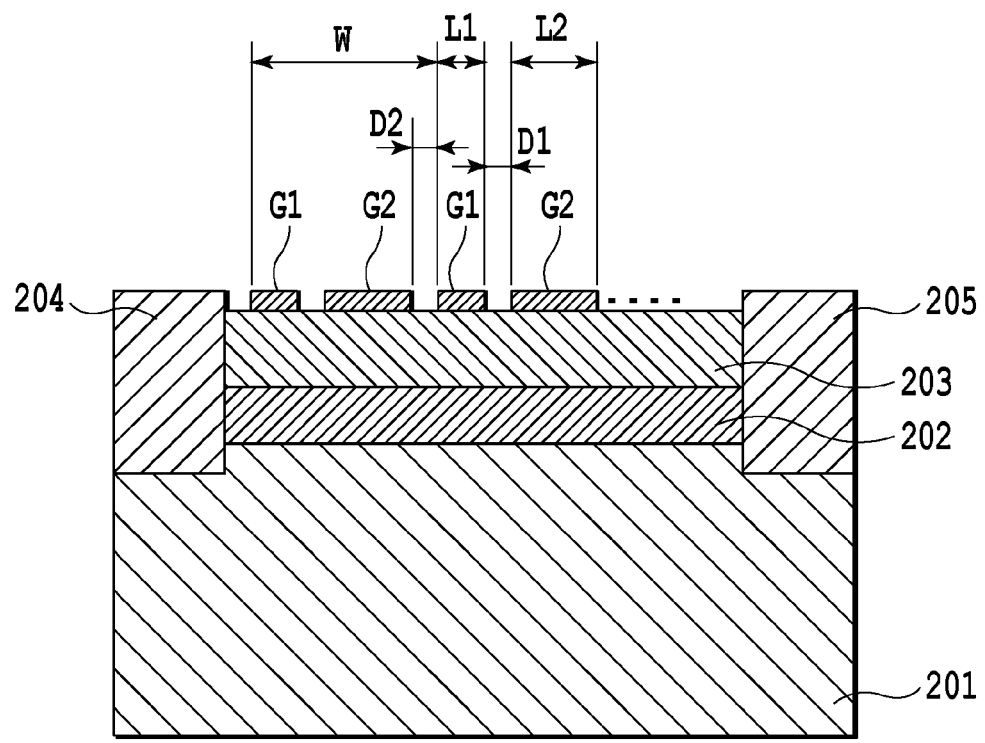
FIG. 5 is a diagram showing a terahertz electromagnetic wave conversion device according to the present invention.

A terahertz electromagnetic wave conversion device according to the present invention is shown in FIG. 5. The structure is substantially the same as that for the conventional terahertz electromagnetic wave conversion device shown in FIG. 2; however, unequal lengths are employed for a first distance D1 and a second distance D2 extended between each of the fingers of first group gates G1 and the two of the fingers of second group gates G2 that are adjacent to the pertinent finger.

The terahertz electromagnetic wave conversion device can be produced in the following manner. (1) First, a desired heteroepitaxial layer is grown on a semiconductor substrate 201. For example, a GaAs buffer layer (not shown) is epitaxially grown on a semi-insulating GaAs substrate 201, and as an electron transit layer, an InGaAs layer is epitaxially grown on the GaAs buffer layer. Thereafter, as an electron supply layer and a barrier layer for the electron transit layer 202, an InGaP layer is epitaxially grown (by locally being doped with Si donor), and a highly doped InGaAs layer (not shown) to which high-density Si has been injected for a source 204 and a drain 205 is grown on the InGaP layer.

(2) Next, the surface of the heteroepitaxial layer is rinsed, and (3) the heteroepitaxial layer is etched except for a region (called a "mesa") that serves as a field effect transistor (isolation of elements). (4) Then, photoresist coating, exposure and etching are performed to specify the regions for forming the source 204 and the drain 205, and (5) the source 204 and the drain 205 are formed by performing metal deposition and the lift-off process.

(6) The extra portion of the highly-doped layer is removed from the electron transit layer region in the active area (mesa) of the transistor by performing photoresist coating, exposure and etching, and (7) the areas for forming the first and the second group gates G1 and G2 are specified by performing photoresist coating, electron beam exposure and etching. Thereafter, (8) the first and second group gates G1 and G2 are formed by performing metal deposition and the lift-off process.

(9) Following this, photoresist coating, exposure and etching are performed to specify a metal wiring portion (not shown) that includes the source 204, the drain 205, the first and second group gates G1 and G2 and a pad extraction electrode portion (not shown), and (10) the metal wiring portion is formed by performing metal deposition and the lift-off process. (11) Thereafter, passivation is performed by employing an insulating film (not shown), such as SiN. (12) Finally, the pad extraction electrode portion is specified by performing the photoresist coating, exposure and etching, and the insulating film is removed from the pad extraction electrode portion.

The inventors of the present invention conducted electromagnetic field numerical analysis, and verified that when the first distance D1 and the second distance D2 were unequal lengths, remarkable improvement was obtained for the efficiency of conversion between terahertz electromagnetic wave energy and direct current energy. A simulation model is shown in FIG. 6, and the result obtained by the simulation is shown in FIG. 7.

Figure 6:
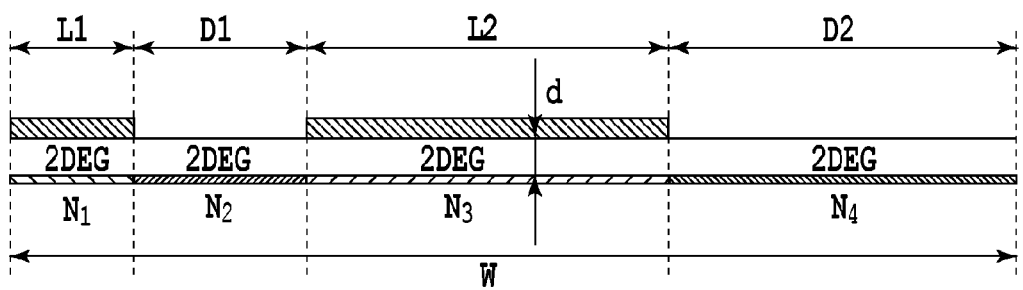
FIG. 6 is a diagram illustrating a simulation model for the terahertz electromagnetic wave conversion device according to the present invention.

For simplifying the simulation, in FIG. 6, electron densities $N_1$ to $N_4$ of the individual areas are set as the same value of $2.57 \times 10^{16}$ m$^{-2}$ ($=2.57 \times 10^{12}$ cm$^{-2}$). Further, a gate length L1 provided for the first group gates G1 is set as 0.1 µm, and a gate length L2 provided for the second group gates G2 is set as 0.6 µm, periodicity W is set as 0.9 µm, the number of repetitions of a fundamental periodic structure is set as 89 (therefore, the distance relative to the electron transit layer 202 is 80.1 µm), and a distance d between the surface of the HEMT structure and the area where the 2 DEG is present is set as 65 nm. Furthermore, the source end is short-circuited, and a source-drain DC bias current is set as 0.5 A for 1 mm of a gate width Lw (a length in the depthwise direction that is perpendicular to the surface of paper) (i.e., 0.5 A/mm).

A specific simulation method should be referred to non-patent literatures 1 to 3, and the overview of this method will be described below. (1) First, the Poisson's equation is solved by employing the potentials of the first and the second group gates G1 and G2 and the potential of the drain 205, and a charge density distribution is obtained for charges that are spatially distributed in the area of the two-dimensional electron layer. The charge density distribution is employed for the Maxwell's equation to solve the spatial distribution of the electromagnetic field. The plasma wave is provided as temporal spatial fluctuations of the charge density distribution. As methods for solution, there are time domain analysis and frequency domain analysis, and since acquisition of an electric field distribution in the steady state is only required, frequency domain analysis is employed for this embodiment. (2) For a targeted periodic structure prepared by interdigitated dual-grating gates, the electric field and the magnetic field, and current components provided by these fields can be expressed based on the Fourier series, for which the fundamental standing waves defined by the periodic structure are employed as the fundamental components. For solving the Maxwell's solution, the electric field and the components are separated into the Fourier series components. There are various solution methods, and in this embodiment, the Galerkin method is employed (see non-patent documents 1 and 2). (3) When the spatial distribution of the electric field and the current components is obtained, coupling of the electromagnetic wave and the plasmon, i.e., the absorbance of the electromagnetic wave by the plasmon, can be calculated. The absorbance is obtained, according to the Joule's laws, by employing a ratio of the real part of spatial integration of a product of the current density and the electric field, with respect to the energy of incident electromagnetic waves, i.e., a ratio of the electromagnetic wave energy absorbed in the plasmon area, with respect to the incident electromagnetic wave energy (see non-patent document 2). (4) When the spatial distribution for the charge density and the electric field is obtained, hydrodynamic equations for the plasma waves in the two-dimensional electron layer are calculated to obtain the current components of the plasma waves as a product of the charge density and the fluctuation of the electron velocity. In this case, according to this invention for which the periodic structure is employed, the Fourier series expansion can also be performed to analytically separate the charge density and the electron velocity component into the individual Fourier component. When a DC current component $\delta jdc$ of the plasma wave is obtained, a response to the terahertz electromagnetic wave is acquired as a fluctuation $\delta Vds$ of a drain potential $= -\delta jdc \times Lw/\sigma O$. Here, Lw denotes a gate width (a length in the depthwise direction), and $\sigma O$ denotes a DC conductivity for the backgrounds (a DC conductivity in the stationary state without localized variations of the charge density and the electron velocity) (see non-patent literature 3). In the following description, the drain potential fluctuation $\delta Vds$ per incident power of 1 W of the terahertz electromagnetic wave is expressed as a photoresponse (unit: V/W). Further, a case wherein a terahertz electromagnetic wave has entered, perpendicularly from the top, on the side where the gate electrodes are present is employed for the analysis examples.

Figure 2:
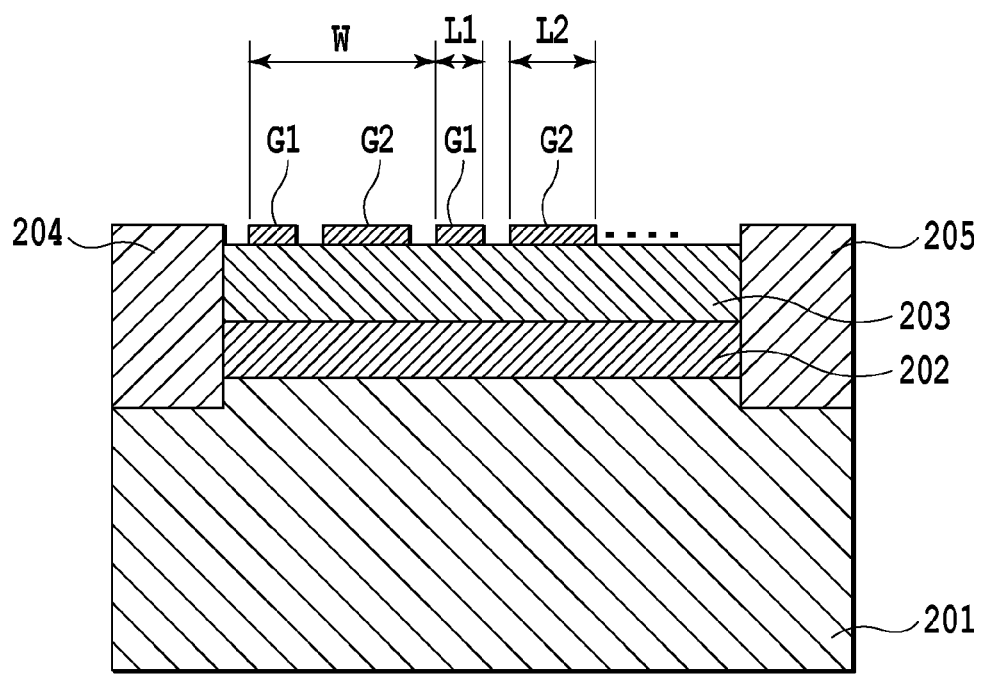
FIG. 2 is a diagram illustrating a conventional terahertz electromagnetic wave conversion device.
Figure 7:
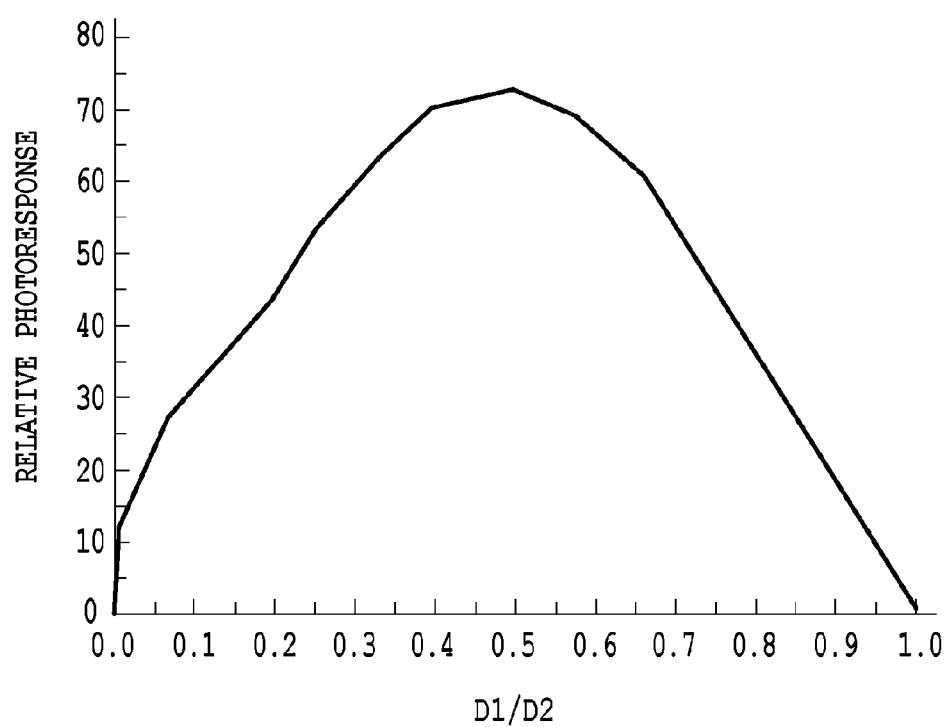
FIG. 7 is a diagram showing the results obtained by performing simulation for the relationship between a relative photoresponse and D1/D2.

The results shown in FIG. 7 are those normalized based on a symmetric photoresponse at the time of D1/D2=1.0. Specifically, compared with the conventional case as shown in FIG. 2, wherein the first group gates G1 and the second group gates G2 are arranged at the same intervals, the photoresponse is improved by making a difference on purpose between the first distance D1 and the second distance D2, and the sensitivity of the photoresponse near D1/D2=0.5 is about 70 times of that for D1/D2=1.0. The relative response reaches a peak when D1/D2 is about 0.5, and when the state wherein 50 times or more of the photoresponse sensitivity is obtained is regarded as a remarkable improvement compared with the prior art, it is apparent from FIG. 7 that it is preferable that D1/D2 be in the range of 0.23≤D1/D2 0.72. For the conventional terahertz electromagnetic wave conversion device shown in FIG. 2, D1/D2=1.0, and since the physical significance that the gate intervals should be asymmetrical as in the present invention was not understood, there was no reason that the first distance D1 and the second distance D2 should be different. Furthermore, from the standpoint of the manufacturing processing, when asymmetric gate intervals were employed, strict control and management of the exposure condition were required, and only disadvantages, such as reduction of production yields and increase in the manufacturing costs, were found. However, as will be described in detail below while referring to the drawings, the inventors of the present invention employed asymmetric gate intervals, i.e., set unequal lengths for the first distance D1 and the second distance D2, so that plasma instability could be generated, and as a result, found that the efficiency of conversion between terahertz electromagnetic wave energy and direct-current energy via plasma waves could be remarkably improved, i.e., the response sensitivity of light (terahertz electromagnetic wave) for the detection operation, and the electromagnetic wave radiation intensity for the oscillation operation could be remarkably increased.

Figure 8:
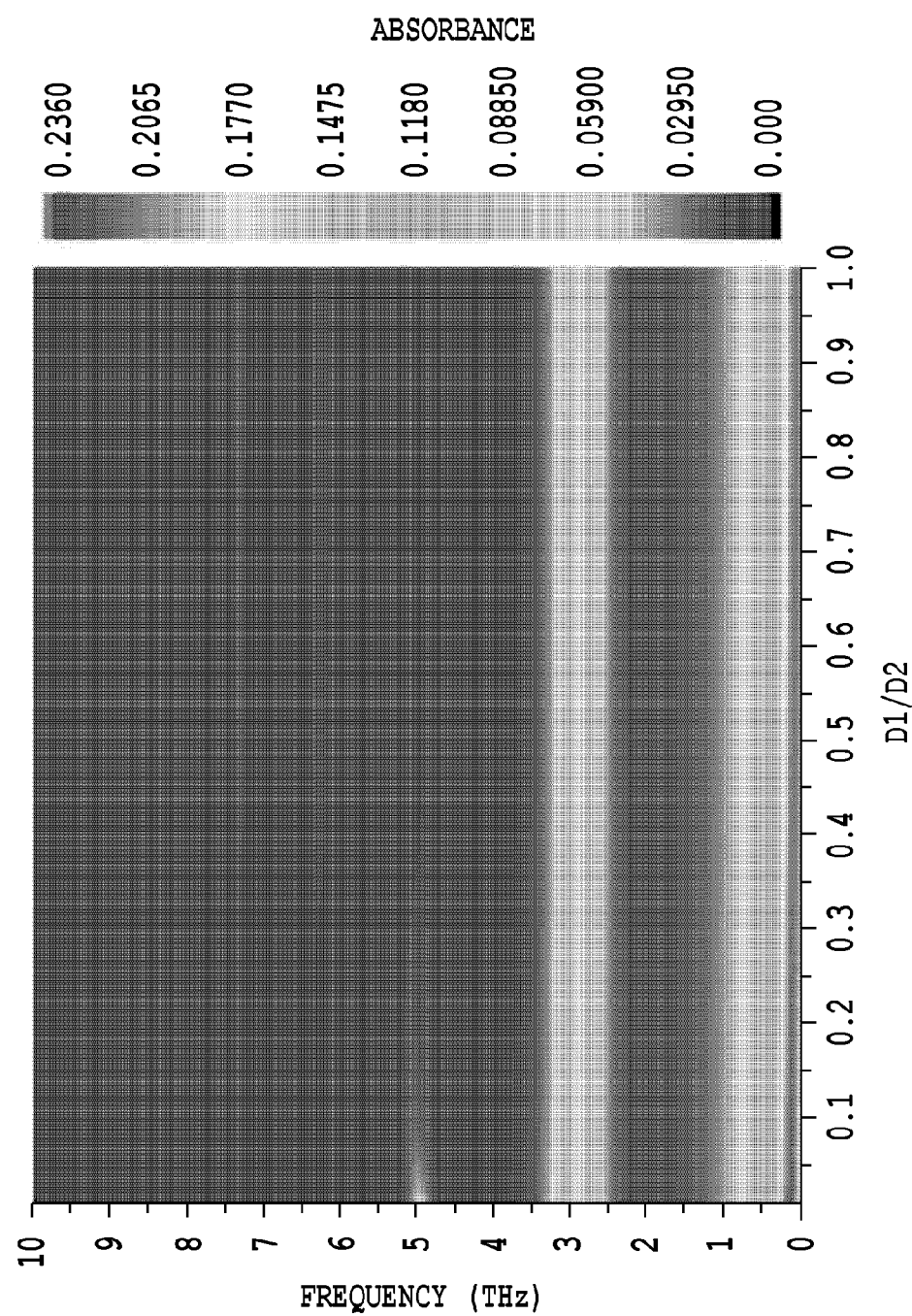
FIG. 8 is a diagram showing the results obtained by performing simulation for the relationship between absorbance and D1/D2.

FIG. 8 is a diagram showing the results obtained by performing a simulation, employing the model in FIG. 6, for a relationship between the absorbance and D1/D2 at the individual frequencies. It is apparent from FIG. 8 that the absorbance of the terahertz electromagnetic waves is uniform, without depending on D1/D2, and is uniformly high at a specific frequency that corresponds to the plasmon resonant frequency.

Figure 9:
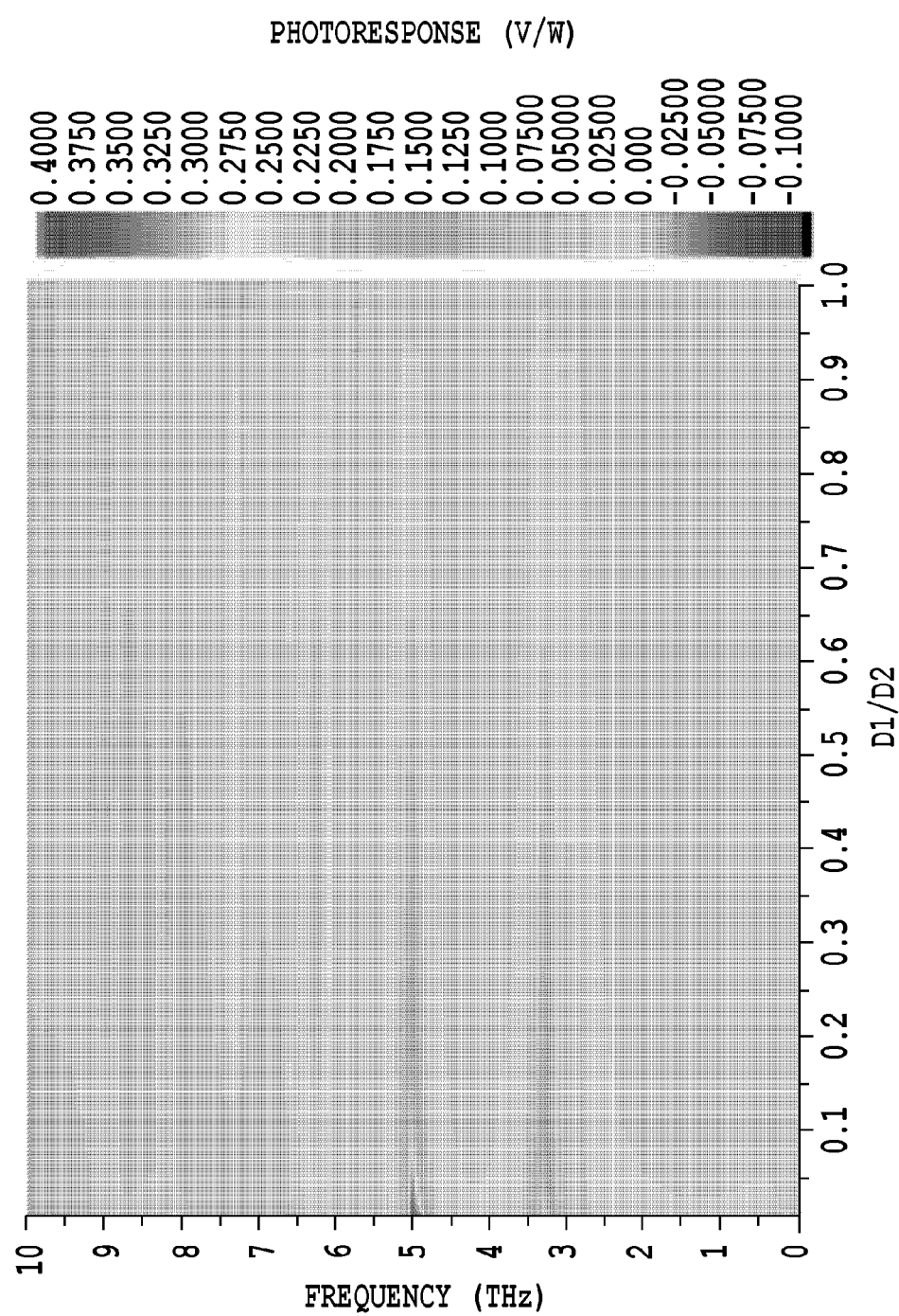
FIG. 9 is a diagram showing the results obtained by performing simulation for the relationship between a photoresponse, at each frequency, and D1/D2.

The results obtained by performing a simulation for a relationship between a photoresponse and D1/D2 at the individual frequencies are shown in FIG. 9. At 6.4 THz, a photoresponse at D1/D2=1.0 is about 0.03, and when this value is employed to normalize the photoresponse at 6.4 THz, a graph that corresponds to the one for the relative photoresponse shown in FIG. 7 is obtained.

The important point shown in FIGS. 8 and 9 is that the absorbance that indicates the efficiency of conversion from terahertz electromagnetic waves into plasma waves does not substantially depend on D1/D2 that represents symmetry of the interdigitated dual-grating gates, but the photoresponse (the fluctuation of a DC voltage) obtained by conversion into plasma waves, i.e., the efficiency of conversion from terahertz electromagnetic wave energy into direct current energy is noticeably improved by the present invention.

Figure 10:
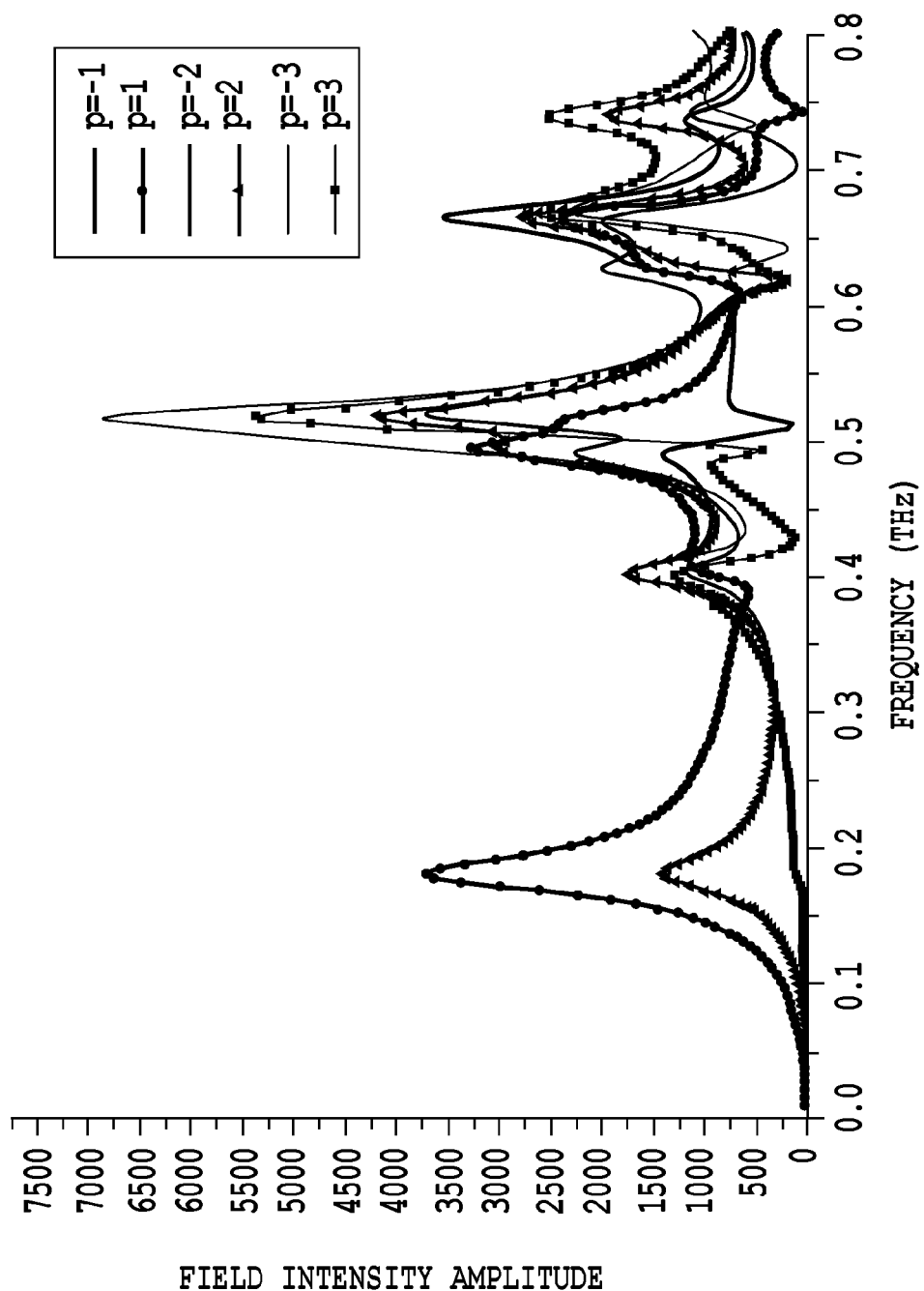
FIG. 10 is a diagram showing, in order to explain plasma instability, the results obtained by performing the Fourier series expansion and analysis for the field intensity amplitude in a case of D1/D2=0.5.
Figure 11:
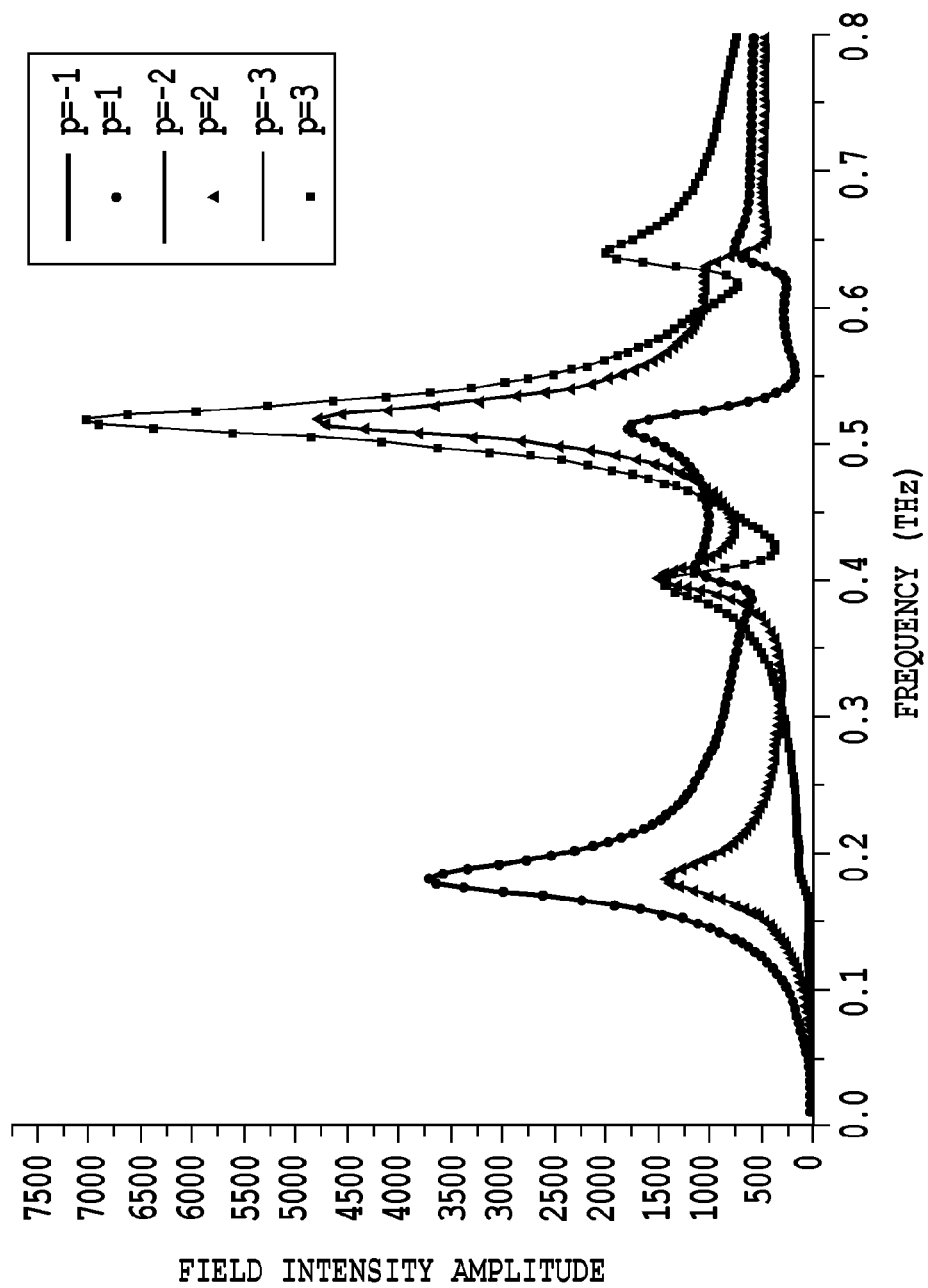
FIG. 11 is a diagram showing, as a comparison, the results obtained by performing the Fourier series expansion and analysis for the field intensity amplitude in a case of D1/D2=1.0.

While referring to FIGS. 10 and 11, an explanation will be given for an asymmetric boundary condition required for the improvement of photoresponse sensitivity, i.e., sensitivity of detection of terahertz electromagnetic waves. Here, for simplifying a simulation, electron densities $N_1$ to $N_4$ of the individual areas are set as the same value of $2.57 \times 10^{16}$ m$^{-2}$ (=$2.57 \times 10^{12}$ cm$^{-2}$). The gate length L1 of the first group gates G1 is set to 0.5 μm, the gate length L2 of the second group gates G2 is set to 2.0 μm, the periodicity W is set to 4.0 μm, the number of repetitions of the fundamental periodic structure is 50 (therefore, the distance relative to the electron transit layer 202 is 200 μm), and the distance d between the surface of the HEMT structure and the area where the 2 DEG is present is set to 40 nm. Further, the source end is short-circuited, and the source-drain DC bias current is set to 0.5 A for 1 mm of the gate width Lw (a length in the depthwise direction that is perpendicular to the surface of paper) (i.e., 0.5 A/mm). FIG. 10 shows the results obtained by performing, in a case of D1/D2=0.5, the Fourier series expansion and analysis for the field intensity amplitude. The graph for p=1, 2 and 3 represents, for the model in FIG. 6, the field intensity amplitude near the center of a gap on the right side of the second group gates G2, and the graph for p=−1, −2 and −3 represents the field intensity amplitude near the center of a gap on the left side of the second group gates G2. As apparent from FIG. 10, in the asymmetric structure, there is a great difference in the field intensity between the left side and the right side of the gate. As a result, the asymmetric boundary condition can be obtained, and the photoresponse sensitivity can be greatly improved. FIG. 11 shows comparison analysis results performed in a case of D1/D2=1.0. It is apparent that the symmetric boundary condition where the field intensity matches on the left and right sides of the gate is provided, and the asymmetric boundary condition is not established.

FIGS. 7 and 9 depict that the photoresponse sensitivity, i.e., the detection sensitivity for the terahertz electromagnetic wave, is greatly improved, and as described above, it goes without saying that, when the asymmetric boundary condition is provided, the plasma instability is truly induced, and the capability for oscillation and radiation of terahertz electromagnetic waves is also considerably improved.

In the above explanation, the same value has been employed for the electron densities $N_1$ to $N_4$ of the individual areas below the gates, and an example where the electron density $N_1$ below a gate having a smaller width is set greater than the other areas will be given.

Figure 12:
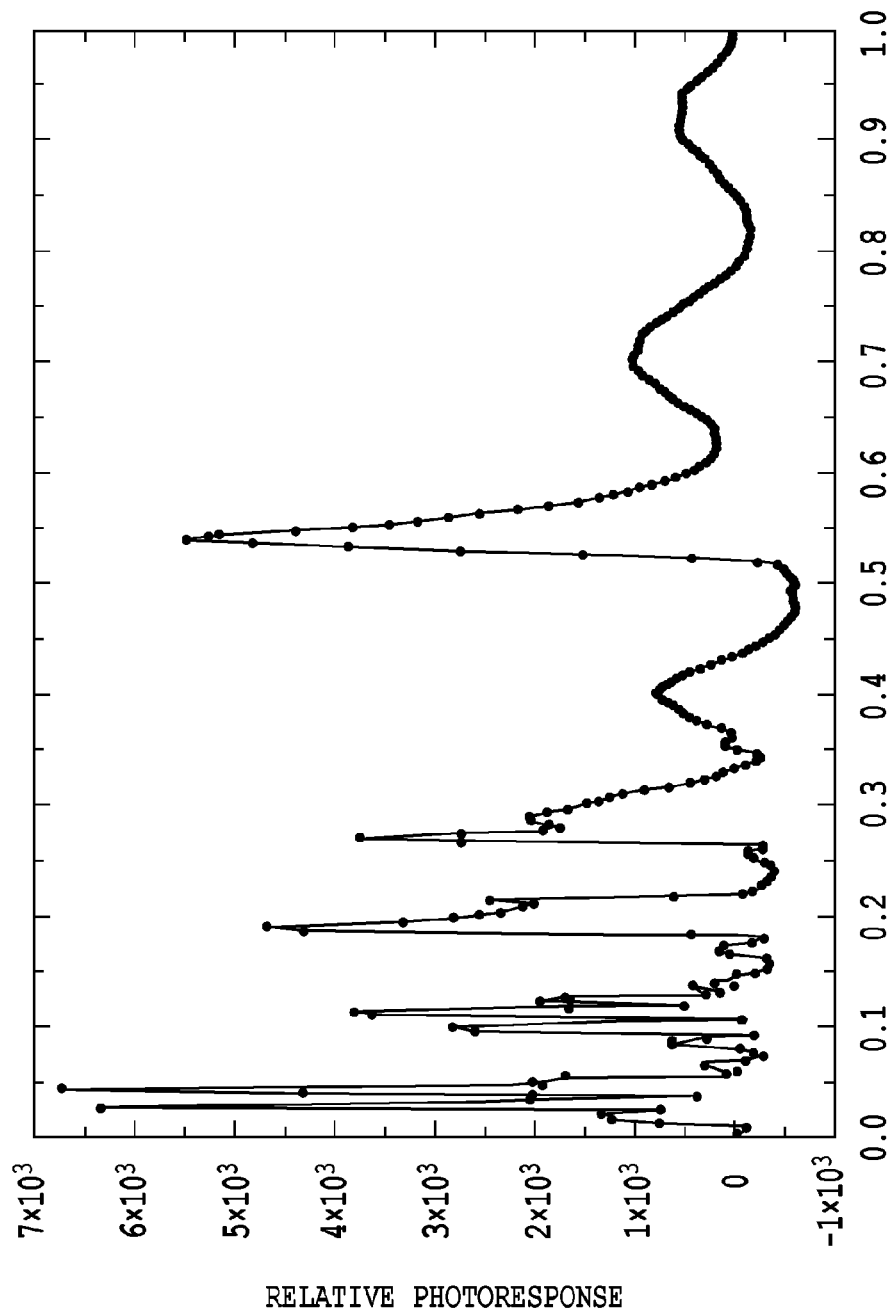
FIG. 12 is a diagram showing the results obtained by performing simulation for the relationship between a relative photoresponse and D1/D2.

FIG. 12 is a diagram showing the results obtained by performing a simulation for a relationship between a relative photoresponse and D1/D2. The electron density $N_1$ of the individual areas below narrower gates is set to $2.57 \times 10^{16}$ m$^{-2}$, and the electron densities $N^2$ to $N^4$ of the other areas are set to the same value of $2.57 \times 10^{15}$ m$^{-2}$. The other conditions are the same as those employed for FIGS. 7 to 9. Specifically, the gate length L1 provided for the first group gates G1 is set to 0.1 μm, and the gate length L2 provided for the second group gates G2 is set to 0.6 μm, the periodicity W is set as 0.9 μm, the number of repetitions of the fundamental periodic structure is set as 89 (therefore, the distance relative to the electron transit layer 202 is 80.1 μm), and the distance d between the surface of the HEMT structure and the area where the 2 DEG is present is set as 65 nm. Furthermore, the source end is short-circuited, and the source-drain DC bias current is set as 0.5 A for 1 mm of the gate width Lw (the length in the depthwise direction that is perpendicular to the surface of paper) (i.e., 0.5 A/mm). The results in FIG. 12 are those normalized based on the photoresponse obtained at D1/D2=1.0. The photoresponse sensitivity near D1/D2=0.5 is about $5.5 \times 10^3$, which is much greater almost by two digits than the results in FIG. 7. These results are based on the assumption of the actual usage condition where the device of the present invention is actually employed, and since more effective confinement of plasma waves has occurred, due to a great difference between the electron densities, in the individual areas below the narrower gates, for which the electron densities are higher by one digit, the resonance phenomenon of the plasma waves represented by equation (1) has occurred more strongly. Further, compared with the results shown in FIG. 7, there is a plurality of noticeable peaks at which the dependency of the photoresponse relative to D1/D2 is sensitive and the intensity thereof is different. As previously described, the photoresponse is provided based on the distortion components due to the nonlinear characteristic of the plasma wave, i.e., by superimposing the high-frequency high-order component of the plasma wave relative to the fundamental standing wave. In the came of the results of this invention, since the electron density spatial distribution has occurred in the electron transit layer in the source-drain direction, the phase characteristic of the high-frequency high-order component sensitively depends on the asymmetry of the field intensity distribution that is determined in accordance with D1/D2. As a result, strong D1/D2 dependency appears on the photoresponse that is the direct current component (the fluctuation of the drain current component from the initial temporal average value due to the plasma wave). Referring to FIG. 12, the peak is D1/D2=0.54, and the condition that 50 times or more of the relative light intensity is obtained under the constant electron density condition shown in FIG. 7 can be obtained in the range of 0.52≤D1/D2≤0.78. Further, as an incomparable intensity, the condition where the relative light intensity is 1000 times or more can be obtained within the range of 0.53 D1/D2≤0.58. Therefore, 0.53≤D1/D2≤0.58 is preferable for the effective operation of the present invention. The most preferable value is about 0.55.

FIG. 12, as well as FIG. 7, shows great increase of the photoresponse sensitivity, i.e., the detection sensitivity of terahertz electromagnetic waves, and as described above, when the asymmetric boundary condition is provided, the plasma instability is truly induced and the plasma wave resonance phenomenon occurs more strongly, and therefore, the capability for oscillation and radiation of terahertz electromagnetic waves is also considerably improved.

Figure 13:
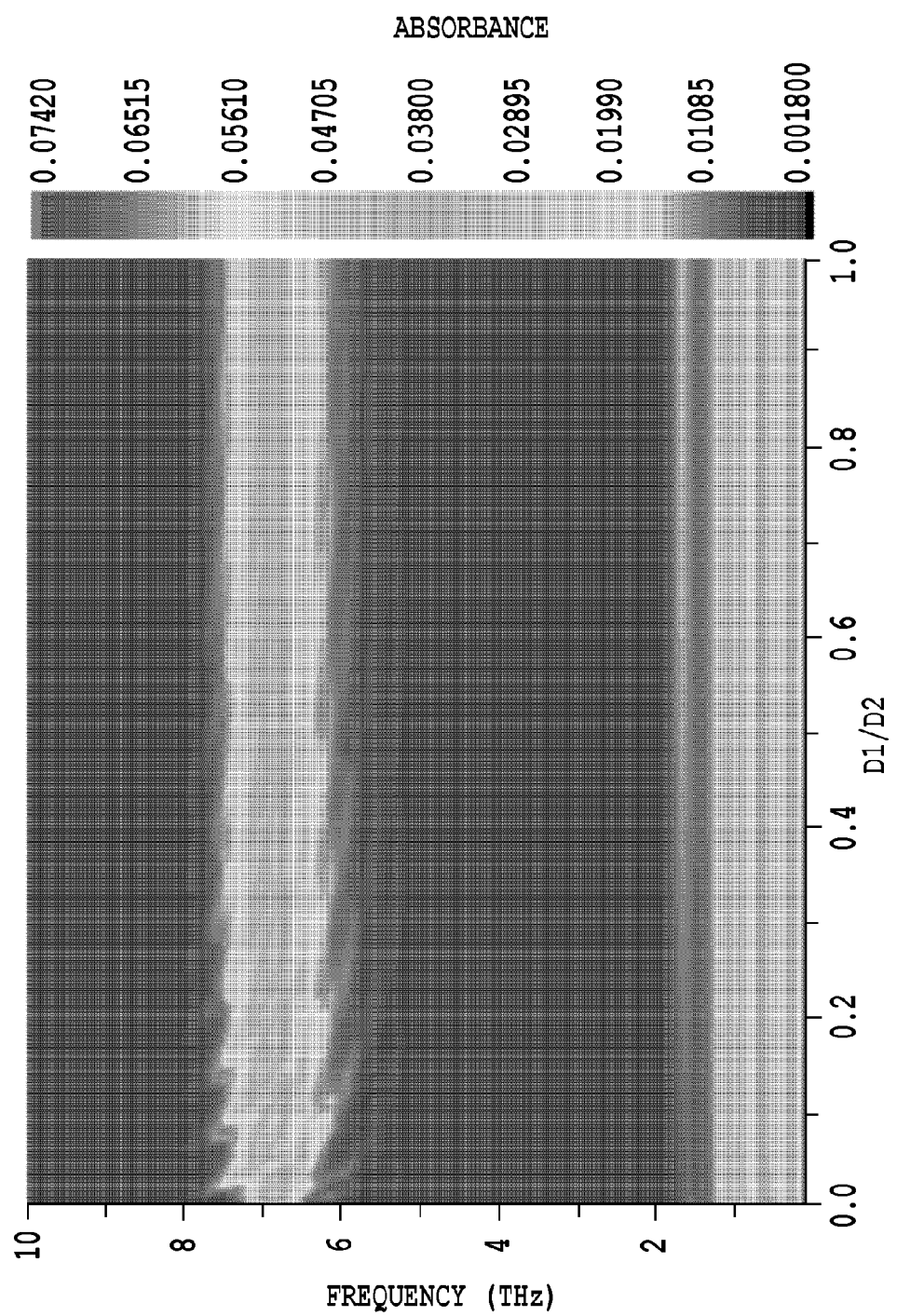
FIG. 13 is a diagram showing the results obtained by performing simulation for the relationship between absorbance and D1/D2.

FIG. 13 is a diagram showing the results obtained by performing a simulation for a relationship between the absorbance and D1/D2 for the individual frequencies. For the simulation, the model shown in FIG. 6 is employed under the same condition as that in FIG. 12. It is apparent from FIG. 13, as well as FIG. 8, that the absorbance of terahertz electromagnetic waves is uniform, without depending on D1/D2, and is uniformly high at a specific frequency (7.0 THz) that corresponds to the plasmon resonance frequency.

Figure 14:
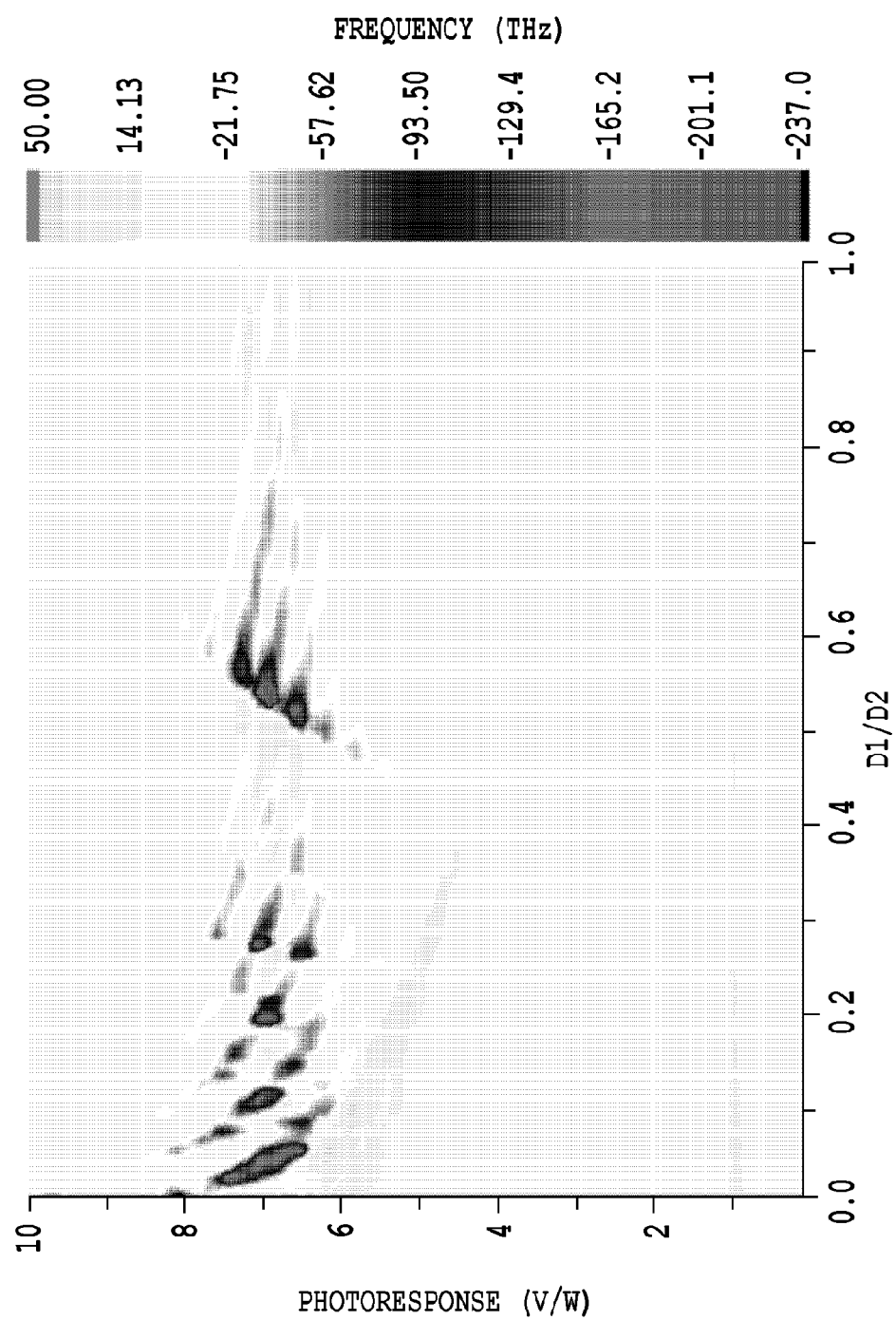
FIG. 14 is a diagram showing the results obtained by performing simulation for the relationship between a photoresponse, at each frequency, and D1/D2.

FIG. 14 shows the results obtained by performing a simulation for a relationship between a photoresponse and D1/D2 for the individual frequencies. When the photoresponse is normalized at 7.0 THz, a graph that corresponds to that in FIG. 12 for the relative photoresponse is obtained.

The important point shown in FIGS. 13 and 14 is that the absorbance that indicates the efficiency of conversion from terahertz electromagnetic waves into plasma waves does not substantially depend on D1/D2 that represents symmetry of the interdigitated dual-grating gates, but the photoresponse (the fluctuation of a DC voltage) obtained by conversion into plasma waves, i.e., the efficiency of conversion from terahertz electromagnetic wave energy into direct current energy, is noticeably improved by the present invention.

In the explanation given for FIGS. 6 to 14, specific numerical values, such as the gate length, have been referred to; however, it should be noted that the numerical values employed for the present invention are not limited to those values.

Second Embodiment

The discussion has been brought, without taking into account the influence of, with respect to the electron density, a source-drain potential difference $V_{DS}$ that is accompanied by a bias current applied between the source and the drain. However, actually, due to the bias potential difference $V_{DS}$, a voltage applied between the gate and the area where plasma waves are present is dropped from the source to the drain, and therefore, the electron density n is reduced. As a result, the resonant frequency differs in the individual plasmon areas immediately below the gates of the interdigitated dual-grating gates structure, and spectral line broadening would occur in terahertz electromagnetic waves to be detected or to be radiated.

An example technique for suppressing broadening of spectral lines can be the one disclosed in patent literature 2. As apparent from equation (1), the resonant frequency for each plasmon area is proportional to the ratio of the square root of the electron density n with respect to the gate length L. When the gate length from the source to the drain is set so that the constant value for the ratio is obtained, unmatched resonance frequencies can be avoided, and the spectral broadening can be suppressed. At this time, while complicated structure design is required, the constant periodicity W and constant D1/D2 can be obtained. Furthermore, it should also be noted that, even when the periodicity for fingers is not constant for the first group gates G1 and the second group gates G2, constant D1/D2 need only be obtained to provide the asymmetric boundary condition, and the present invention can be effectively operated. When the technique for suppressing spectral broadening is employed together with the present invention described in the first embodiment, both of extremely high efficiency for conversion between terahertz electromagnetic waves and plasma waves and spectral narrowing can be provided.

It is preferable that the structure be designed, so that the ratio of the square root of the electron density n with respect to the gate length L can be a constant value, and when the gate length of the gates of at least one of the groups is gradually reduced from the source to the drain, the effect for suppressing spectral broadening can be obtained.

Figure 3:
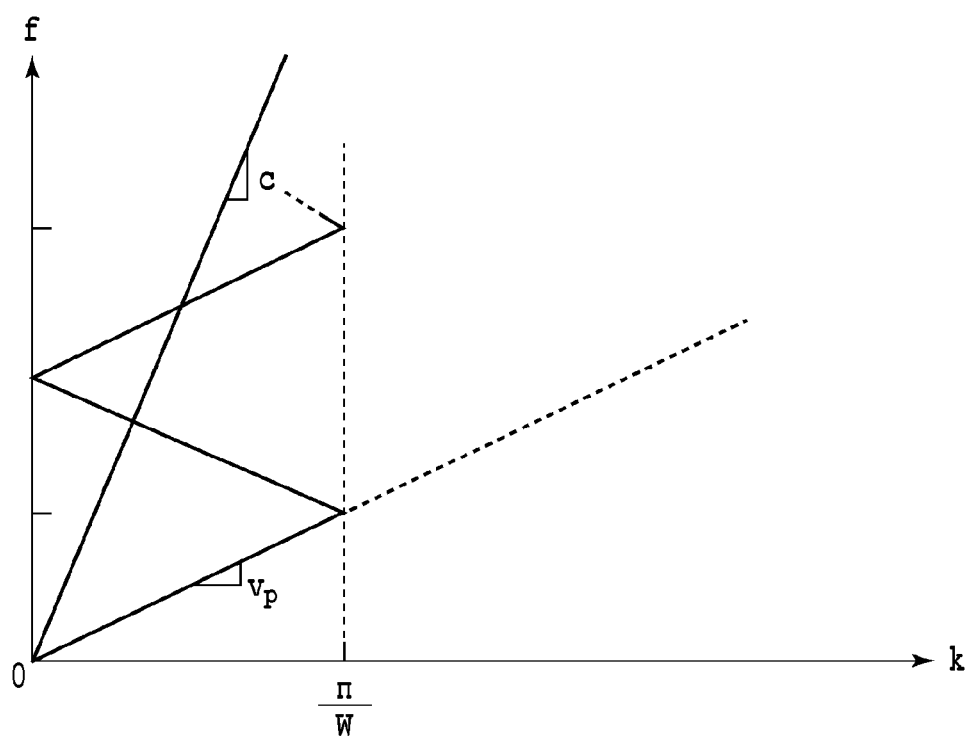
FIG. 3 is a schematic diagram showing a relationship of the wavenumber and the frequency for electromagnetic waves and plasma waves for the terahertz electromagnetic wave conversion device in FIG. 2.
Figure 4B:
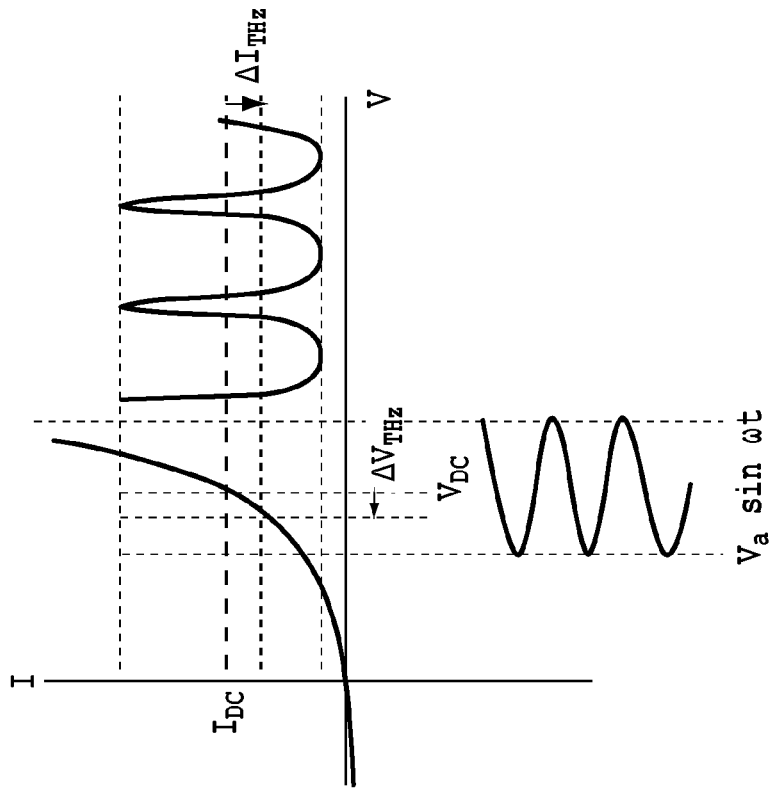
FIG. 4B is a diagram for explaining the non-linearity of the current-voltage characteristics of the Schottky barrier diode.
Figure 4A:
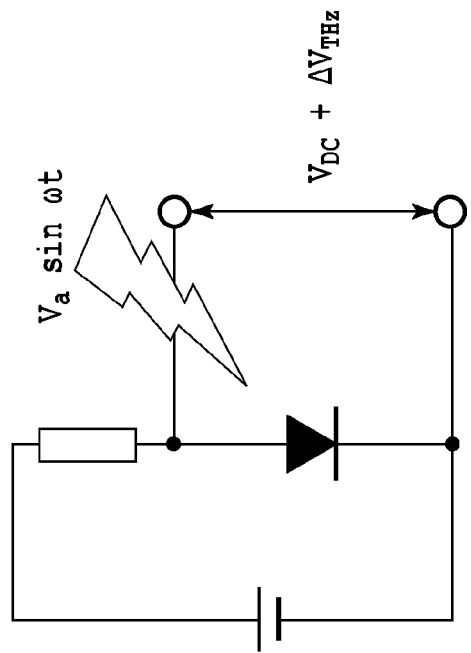
FIG. 4A is a diagram illustrating a terahertz electromagnetic wave detection device that employs a Schottky barrier diode.

Further, in a case wherein the periodicity of the fingers is not constant, the Brillouin zone as explained in FIG. 3 would differ in accordance with the periodicity, and thus, the plasma dispersion characteristics would not be uniformly folded in the Brillouin zone boundary, and the point of intersection between the dispersion line of a terahertz electromagnetic wave and the dispersion line of a plasma wave, at which energy conversion between the terahertz electromagnetic wave and the plasma wave is enabled, would be shifted for each finger. However, as described above, since the speed of the terahertz electromagnetic wave and the speed of the plasma wave differ by two digits or more, the intersection points between the dispersion line of the terahertz electromagnetic wave and the dispersion line of the plasma wave, whereat energy conversion between the terahertz electromagnetic waves and the plasma waves is enabled, are located extremely closely, and moreover, since the fluctuation width (the fluctuation width of the Brillouin zone boundary points) of the periodicity of the fingers falls within only one digit, even the change in the intersection points (distribution due to the positions of the fingers) will not much adversely affect the efficiency of conversion between the terahertz electromagnetic waves and the plasma waves.

The invention claimed is:

1. A terahertz electromagnetic wave conversion device with a field effect transistor structure having a source, gates and a drain, the terahertz electromagnetic wave conversion device comprising on a surface of the field effect transistor structure in a direction toward the drain from the source:
first group of gates having a plurality of fingers arranged in parallel at equal intervals; and
second group of gates having a plurality of fingers arranged in parallel at equal intervals;
wherein each finger of the first group gates and each finger of the second group gates are interdigitated each other,
wherein a first empty gap having a first distance D1 between an adjacent finger of the first group gates and a finger of the second group gates on a side of the drain and a second empty gap having a second distance D2 between an adjacent finger of the first group gates and a finger of the second group gates on a side of the source are unequal lengths.

2. The terahertz electromagnetic wave conversion device according to claim 1, wherein D1/D2 is about 0.55.

3. The terahertz electromagnetic wave conversion device according to claim 1, wherein gate lengths of the first group gates are gradually reduced from the source to the drain and/or gate lengths of the second group gates are gradually reduced from the source to the drain.

4. The terahertz electromagnetic wave conversion device according to claim 1, wherein the source is commonly terminated (grounded), and a DC bias current is applied between the source and the drain.

5. The terahertz electromagnetic wave conversion device according to claim 4, wherein the gate length of the first group gates is smaller than the gate length of the second group gates, and
an electron density below the first group gates is higher than an electron density below the second group gates.

6. The terahertz electromagnetic wave conversion device according to claim 5, wherein the gate length of the first group gates is gradually reduced from the source to the drain.

7. The terahertz electromagnetic wave conversion device according to claim 6, wherein the gate length is determined so that, for each finger of the first group gates, a ratio of the square root of an electron density with respect to the gate length is a constant value.

8. The terahertz electromagnetic wave conversion device according to claim 1, wherein the field effect transistor structure is an HEMI structure.

9. The terahertz electromagnetic wave conversion device according to claim 1, wherein the first empty gap and the second empty gap each respectively define a gap between adjacent fingers of the first group gates and second group gates such that no other fingers of the first group gates or second group gates are therebetween.

* * * * *